United States Patent [19]

Gajda

[11] 4,393,096

[45] Jul. 12, 1983

[54] ALUMINUM-COPPER ALLOY EVAPORATED FILMS WITH LOW VIA RESISTANCE

[75] Inventor: Joseph J. Gajda, Wappingers Falls, N.Y.

[73] Assignee: International Business Machines Corporation, Armonk, N.Y.

[21] Appl. No.: 420,174

[22] Filed: Sep. 20, 1982

Related U.S. Application Data

[63] Continuation-in-part of Ser. No. 321,833, Nov. 16, 1981, abandoned.

[51] Int. Cl.³ ......................................... H01L 21/285
[52] U.S. Cl. ..................... 427/90; 156/643; 204/192 E; 427/91; 427/96; 427/99; 430/314
[58] Field of Search ...................... 427/90, 91, 96, 99; 204/192 E; 430/314; 156/643

[56] References Cited

U.S. PATENT DOCUMENTS 3,382,568  5/1968  Kuiper .
3,631,305  12/1971  Bhatt et al. .
3,716,469  2/1973  Bhatt et al. .
3,725,309  4/1973  Ames et al. .
3,743,894  7/1973  Hall et al. .
3,830,657  8/1974  Farrar .
3,987,216  10/1976  Bhatia et al. .
4,062,720  12/1977  Alcorn et al. .
4,070,501  1/1978  Corbin et al. .
4,184,909  1/1980  Chang et al. .

OTHER PUBLICATIONS

Howard et al., "Intermetallic Compounds of Al and Transition Metals: Effect of Electromigration in 1–2–N-M-Wide Lines", J. Appl. Phys. 49(7), Jul., 1978, pp. 4083–4093.

Primary Examiner—John D. Smith
Attorney, Agent, or Firm—Henry Powers

[57] ABSTRACT

Controlling $Al_2Cu$ precipitation in copper doped aluminum by evaporating the aluminum metallurgy containing 3 to 4% copper at about 210° C. on $SiO_2$ coated semiconductor devices. In multilevel metallurgy sintering can be optionally performed at 400° C. for 75 minutes to cause intermetal diffusion at vias between the metallurgy levels.

4 Claims, 10 Drawing Figures

ALUMINUM-COPPER ALLOY EVAPORATED FILMS WITH LOW VIA RESISTANCE

RELATED APPLICATIONS

This application is a Continuation-in-Part of U.S. Co-pending application Ser. No. 321,833 filed Nov. 16, 1981 now abandoned.

TECHNICAL FIELD

This invention relates to the fabrication of semiconductor devices, and more particularly to the fabrication of interconnection metallurgy systems atop the semiconductor devices.

BACKGROUND ART

Advances in modern semiconductor device technology have allowed increasing numbers of devices and circuits to be fabricated within a single semiconductor chip. This has required increasing microminiaturization of the interconnection metallurgy system connecting the elements within the chip into circuits. Such miniaturization results in decreased costs and improved performance in integrated circuits but is constantly crowding the fabrication technology, particularly the photolithographic and etching techniques of the interconnection metallurgy.

In integrated circuit design, for example, thousands of impurity regions are conventionally fabricated in a silicon chip, approximately 125–200 mils square. Such regions form transistors, diodes, resistors and the like which are then connected together by thin film wiring patterns atop the chip to form various circuits and for connection to input-output terminals.

This interconnection thin film system atop the chip is extremely complex and usually employs two or three separate levels of complex conductive patterns, each separated by one or more layers of dielectric material. Ordinarily, the first level conductive pattern on the chip surface interconnects the transistors, resistors, diodes, etc. into circuits and also provides for circuit-to-circuit connection. The second level conductive pattern makes contact to the first level by wet or dry etched vias through an insulation layer. With the increase in circuit density such as 10k bit bipolar memories, via size is reduced to 5 µm. Interfacial contaminant films (e.g. oxide) 20 Å in thickness within such small vias become detrimental to circuit switching speeds. The second level conductive pattern conventionally completes the circuit-to-circuit connections and makes contact to I/O terminals which are connectable to a support such as a module, substrate or card. Alternatively, a third level may be required for power and I/O connections. Four levels of metallization may be required in future products.

Aluminum-copper metallurgy has been typically used in the prior art to avoid the electromigration problem, as is discussed, for example, by Hall et al, in U.S. Pat. No. 3,743,894.

In the fabrication of semiconductor device, a contact metal layer of aluminum is generally used to make ohmic contact to the device. When the device is operated under high current and high temperature conditions, the aluminum contact metal is transported by the current flowing therethrough causing the metal to build up in some areas and to form voids in others. The voids can become large enough to sufficiently increase the resistance of the metal contact in the area where the voids occur to allow resistive heating to cause the contact metal to melt, thereby causing premature failure of the device.

Hall et al teaches that to avoid the electromigration problem, aluminum contact metallization is codeposited with a small percentage of copper on the order of 1 to 10 percent by weight. Forming a fine grain structure of $CuAl_2$ grains having a diameter of less than 1000Å interspersed between aluminum grains at the grain boundaries and triple points thereof.

Silicon has been alloyed with the aluminum-copper in the prior art to prevent the aluminum-copper from penetrating into the silicon substrate as is discussed, for example, by Kuiper in U.S. Pat. No. 3,382,568.

The use of aluminum/copper alloys and their methods of deposition are also discussed in U.S. Pats. No. 3,631,305, No. 3,716,469, No. 3,743,894, No. 3,725,309, No. 3,830,657, No. 3,987,216, No. 4,062,720, No. 4,070,501 and No. 4,184,909, which are illustrative of this art.

The addition of copper in aluminum and its deposition by conventional techniques employed heretofore results in metallization highly susceptible to corrosion during semiconductor processing and as well in the formation of large $Al_2Cu$ intermetallics. The preferential formation of Cu rich regions on the metallization surface accelerates oxide growth and corrosion products during normal processing steps or stages. Local $Al_2Cu$ cells set up by the differences in the electromotive series between Al and Cu rich regions form galvanic cells which exacerbate the problem.

It has been found that conventional aluminum/copper metallurgy techniques employed heretofore, result in the formation of copper rich intermetallics ($Al_2Cu$) on the film surface which result in high resistance regions which detract from the operability of the devices as well as reducing yield. The severity of the problem is particularly critical with use of multilevel metallurgy where it is necessary to interconnect the levels at appropriate points, where a high copper concentration occurs at the interfaces of those multilevel interconnections during normal device processing. Such high copper concentrations result in high ohmic connections, which affect circuit functionality. Also, it has been found that with multilevel product, the addition heat treatments (of normal processing) results in formation of intermetallics which in time, will traverse the entire metallurgical structure thus causing field failure.

Further the presence of large areas of copper rich intermetallics on the film surface is a significant factor in causing high resistance vias (e.g. the interconnection points of multilevel metallurgy). The region preferentially grow a thick oxide layer during quartz or $SiO_2$ deposition which is extremely difficult to remove during sputter etch cleaning. The thick oxide results in a high via resistance.

SUMMARY OF THE INVENTION

It has been discovered, in accordance with this invention, that a significant reduction of $Al_2Cu$ intermetallic platelet formation can be obtained by controlling the interrelationship of copper concentration in the alloy and by shutting off the substrate heaters during first level metallurgy deposition. By employing this method the Cu (copper) is preferentially evaporated first, thus keeping the high concentration at the bottom of the film. Shutting the heaters off keeps the Cu from reacting with aluminum which coalesces into large compounds. The absence of Cu at the surface eliminates the surface corrosion.

At the beginning of evaporation, because of the initial high temperatures of the substrate and due to the high vapor pressure of copper, a copper rich (about 20 wt. %) aluminum alloy is initially deposited on the substrate. On cooling of the substrate, during the depositing time, the copper concentration of the depositing Sl/Cu alloy is continually decreased to a level under 1 wt. % in complete solid solutions at final metal film surface. More specifically, this invention comprehends controlling $Al_2Cu$ precipitation, in copper doped aluminum, by evaporating the aluminum metallurgy with 3 to 4 wt. % at about 210° C. on dielectrics (e.g. quartz, $SiO_2$, silicon nitride, etc) coated semiconductor devices. Therefore the $Al_2Cu$ precipitates are controlled to stay at the lower portion of the cross section of the first level. To further keep the $Al_2Cu$ at the lower portion in the first level metallurgy the second interlevel metallurgy evaporation is initiated with the heaters off. Therefore, the Cu in the first metal is prevented from diffusing upwards.

In conjunction therewith for multilevel metallurgy heat treatments, usually employed at 400° C. for 75 minutes, can be eliminated. Satisfactory via resistance is attained when measured directly after evaporation. Elimination of heat treatments enhances yields by preventing metal penetration at contacts.

By reducing the temperature from 290° C. as conventionally employed, to 210° C. during aluminum/copper deposition of the first level metal, and shuting off the substrate heater, the $Al_2Cu$ intermetallic growth is suppressed. Any $Al_2Cu$ intermetallics formed are reduced in size and disposed at the dielectric surface, and not exposed at the metal surface. A sintering operation at 400° C. for 75 minutes is employed, if needed, after a second level Al/Cu alloy deposition solely to reduce the via interface resistance between the double metal layers, by metal diffusion. However, where no $Al_2Cu$ intermetallics are exposed at the surface, the sintering step is not needed.

Accordingly, it is an object of this invention to provide an improved method for formation of aluminum/copper metallurgy or semiconductor devices.

It is another object of this invention to form aluminum/copper multilevel metallurgical films on semiconductor devices with enhanced yield reliability, and corrosion resistance.

Another object of this invention is to provide a method for multilevel aluminum/copper conductor patterns with low via resistance at the points of metal level interconnections.

Another object of this invention is to provide a method for controlling the formation of $Al_2Cu$ intermetallic formation in the deposition of aluminum/copper film deposition.

Another object is to prevent oxide growth on the first level metallurgy, prior to second level metal deposition.

BRIEF DESCRIPTION OF THE DRAWING

In the accompanying drawings forming a material part of this disclosure:

FIGS. 2A and 2B are schematic cross-sectional views illustrating a device fabricated in accordance with this invention.

DISCLOSURE OF THE INVENTION

Figure 1A:
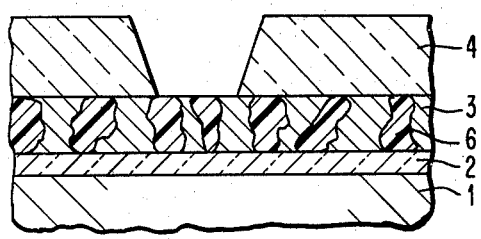
FIGS. 1A and 1B are schematic cross-sectional views illustrating a device fabricated in accordance with conventional techniques.

Other objects, features and advantages of the invention, in addition to those noted above, will become more apparent from the following description of one preferred embodiment of the invention.

The structure shown in the drawings represents a portion of an integrated circuit chip which may be formed by any of the conventional integrated circuit. For purposes of simplicity the drawings show a semiconductor substrate 1 coated with a dielectric or insulator 2 of quartz, silicon dioxide, silicon nitride or a composite thereof. The substrate 1 is comprehended to comprise an integrated circuit which contains active and passive components (not shown) as well as means for electrically isolating the components from each other (not shown). The dielectric layer 2 will normally have contact holes (not shown) for contacting the active and passive components.

Formed on top of the dielectric layer 2 is patterned film 3 of aluminum/copper alloy having a high resistance to electromigration. The conductive film 3 will comprise a portion of a first level conductive pattern which is generally interconnected through dielectric film 2 to doped impurity regions within the semiconductor substrate 1. The Al/Cu alloy metallization 3 can also be connected to other such films in said pattern on the same level to form device-to-device and circuit-to-circuit interconnections, as is well known in the art.

A blanket deposition of the metallization 3, on the substrate, can be achieved through use of standard sputter deposition techniques from an alloy electrode, vapor deposition from an Al/Cu alloy source or by codeposition of aluminum and copper from individual sources. Subsequently the desired conductive pattern can be delineated by photo and Ebeam lithographic techniques, utilizing resist or lift-off technology followed by wet or dry etching (e.g. reactive or sputter etching).

A second dielectric film 4 (e.g. quartz, $SiO_3$, $Si_3N_4$, $SiO_2$ etc) is blanket deposited over the substrate to serve as an insulator between the first level of metallization 3 shown, and a second level of metallization to be applied later, by sputtering chemical vapor deposition or other techniques. This dielectric film 4 is then lithographically patterned to form via holes 5 at points of access to the first level metallization 3, as for example at the points of interconnection to higher levels of metallization.

The prior art deposition of the metallization pattern 3 (as shown in FIG. 1A) is characterized by the formation of grains 6 of $Al_2Cu$ platelets whose controlled size and distribution is one of the objectives of this invention. FIG. 1A illustrates the formation of large $Al_2Cu$ platelets or grains which extend to and on top of the surface of the metallization pattern 3, as results by conventional techniques which deposit an aluminum/copper alloy containing 5 wt % copper at a temperature that reaches a point greater than 300° C. during the deposition cycle.

Figure 1B:
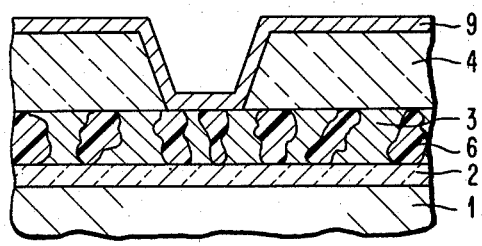
Figure 1C:
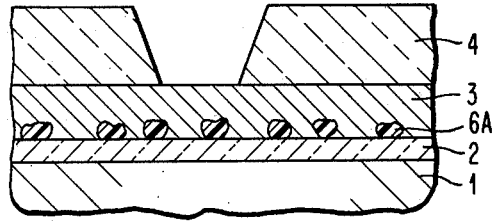
Figure 1D:
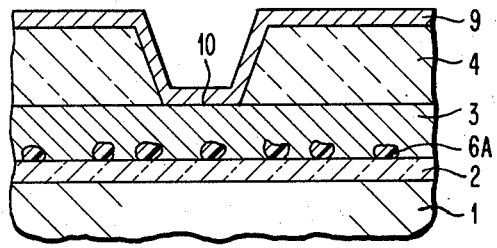

FIG. 1C shows the resultant Al₂Cu intermetallic 6A distribution obtained in accordance with this invention, by reducing the copper content to 3 to 4 wt. % and depositing with the substrate heaters off. By reducing the substrate temperature from an initial temperature of about 180° C. to 200° C. (at which temperatures, the substrates can be conditioned for deposition of first level metallization) toward ambient temperatures [e.g. letting the substrate to thermally float]) during the Al/Cu deposition of the first level metallization 3, the Al₂Cu intermetallic growth is supressed. Such reduction in substrate temperatures is obtained by coincidentally discontinuing the substrate heat at the start of the deposition (evaporation) of the first level metallization. As a result the Al₂Cu intermetallics are near the surface of the dielectric 2 and not exposed at its surface. The combination of temperature reduction during evaporation and decreasing the copper content resulted in a low and consistant via resistance reading as shown in FIG. 3.

Figure 3:
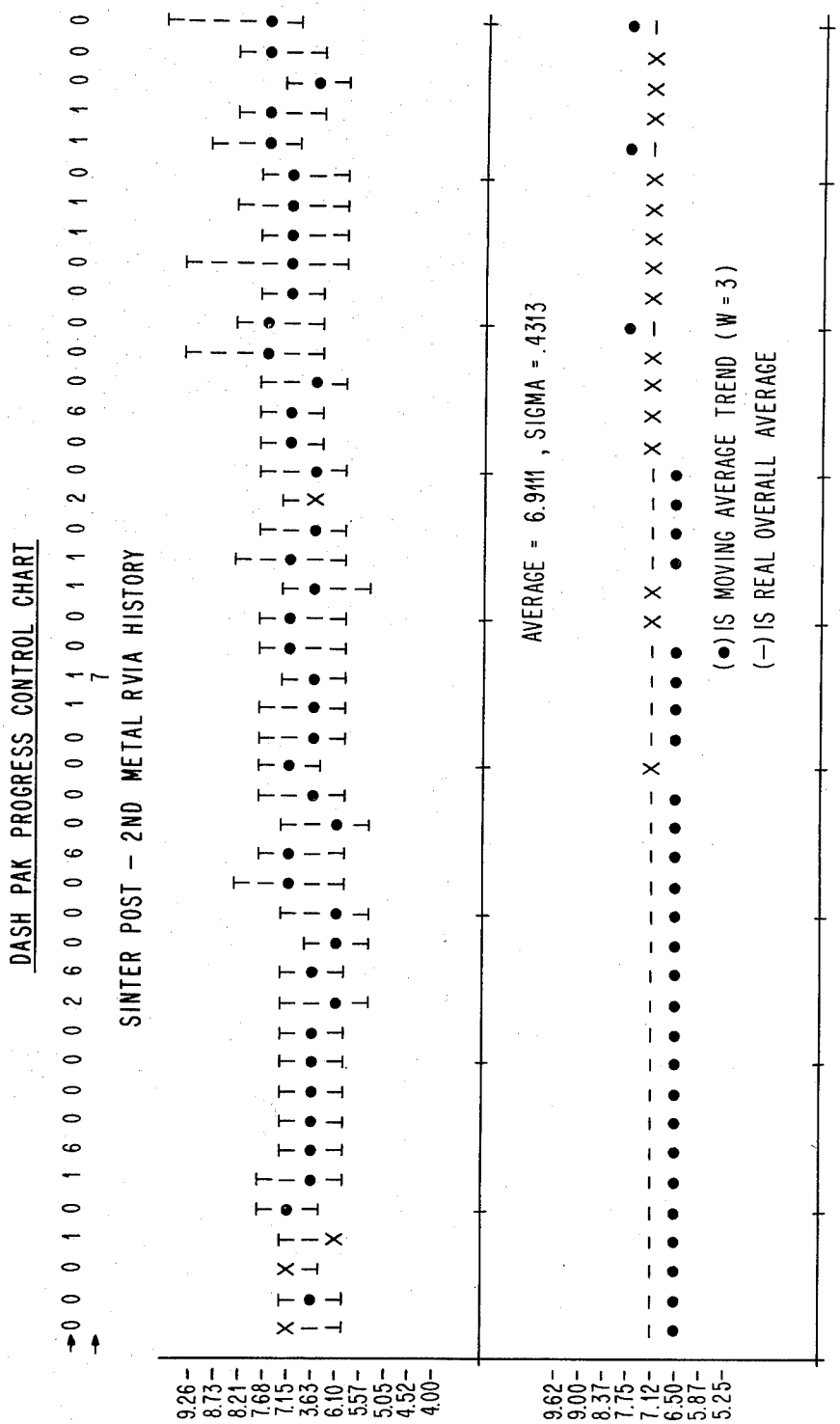
FIGS. 3 and 4 are line data charts for illustrating the distinctions of this invention.
Figure 4:
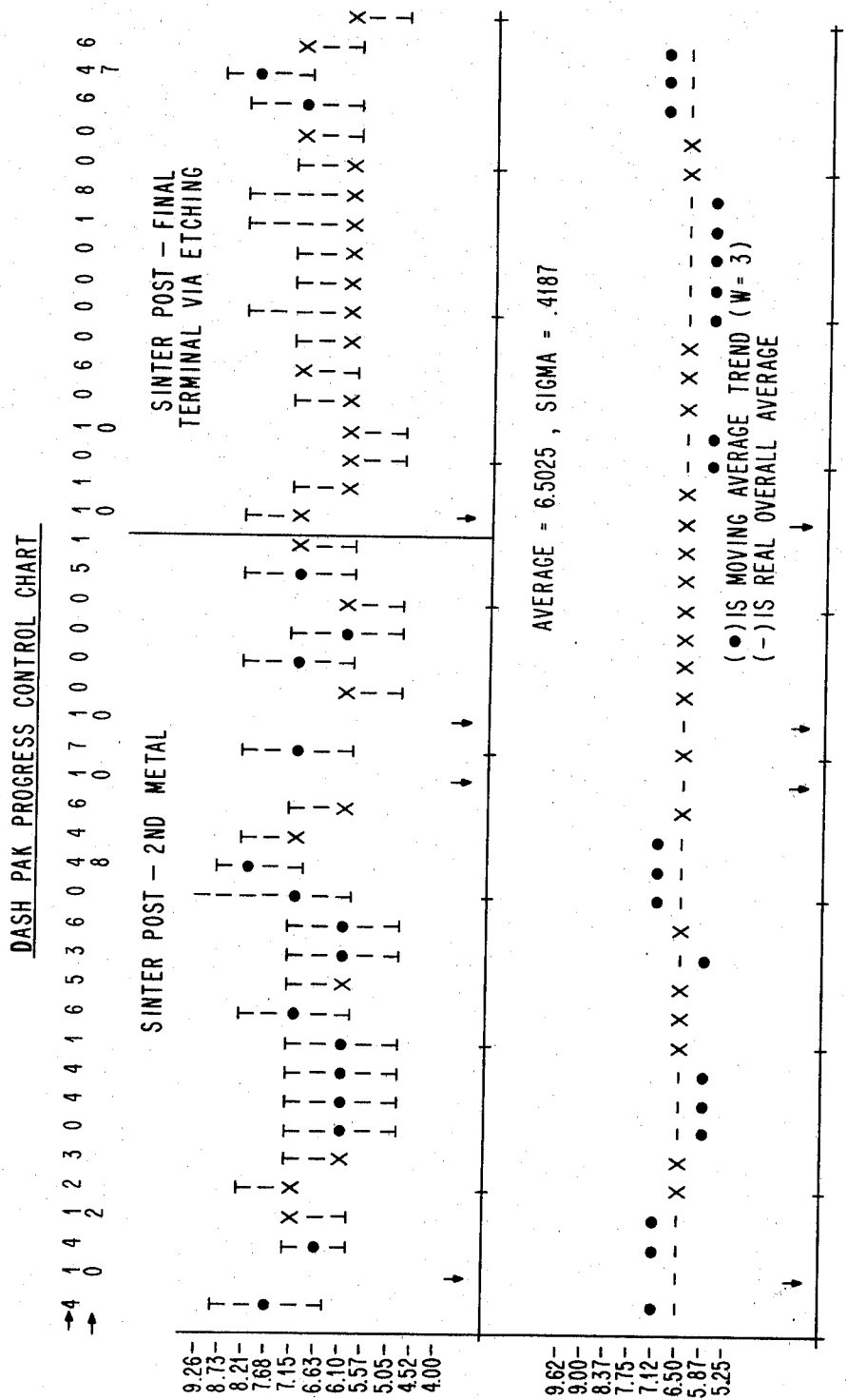

FIGS. 3 and 4 represent via resistance readings taken off via chains. The vertical dimension is in ohms which is taken over several test site runs. The data in FIG. 3 and up to the crossbar in FIG. 4 was taken after the 75 minute sinter step at 400° C. The heat treatment step lowers the via resistance by several orders of magnitude, by reducing the oxide layer and is a required process step. A yield loss is often taken at this step. The significance of data in FIG. 4 (right of crossbar), was taken prior to sintering and still has a lower average reaching and sigma level than the corresponding sintered test sites. That data was complied on vias with the metal films processed with 3-4% Cu, reduced evaporation temperature and, no sinter, with the results forming oxide free via interfaces.

Figure 5A:
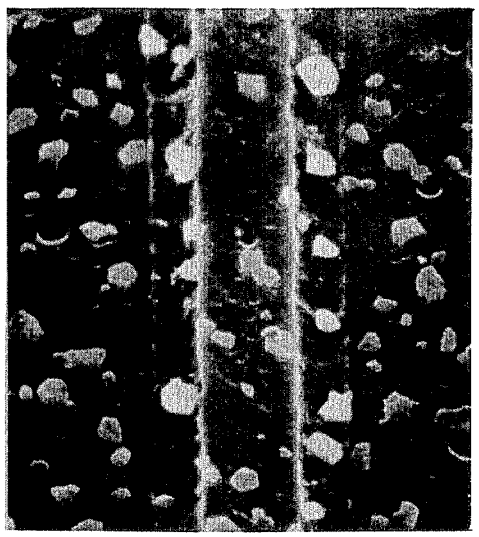
FIGS. 5A and 5B are microphotographs of the plan and cross-sectional views, respectively, of the aluminum/copper alloy metallization deposited on a semiconductor device in accordance with conventional techniques.
Figure 5B:
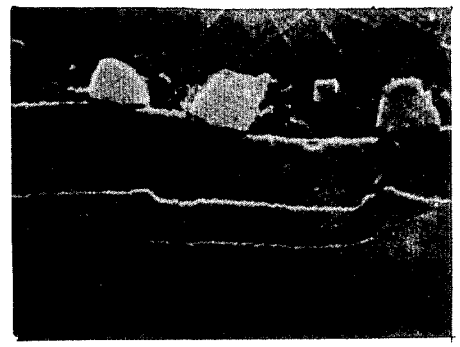

The actual metallographic structures are shown in FIGS. 5A, 5B, 6A and 6B. FIG. 5A (corresponding to FIG. 1A) shows the high density of Al₂Cu intermetallics on the surface where a via will be etched in dielectric layer 4. FIG. 5B shows, in cross-section, the Al₂Cu intermetallics extending from the dielectric layer 2 up to the top surface of the Al/Cu film 3.

Figure 6A:
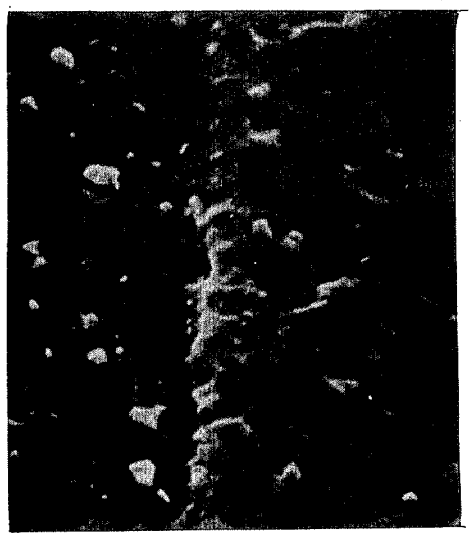
FIGS. 6A and 6B are microphotographs of the plan and cross-sectional views of the aluminum/copper metallization formed in accordance with this invention.
Figure 6B:
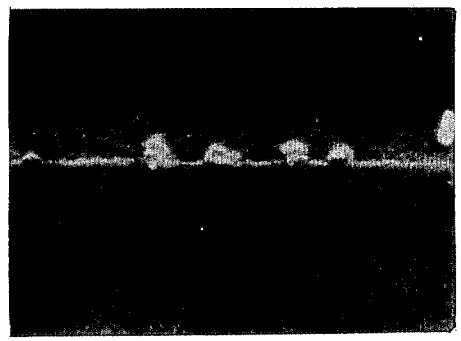

In contrast, FIGS. 6A and 6B (corresponding to FIG. 1B) illustrate the absence of Al₂Cu compounds on the surface of the Al/Cu film 3, after changes were made in the evaporation conditions and Cu concentrations, as described above.

FIGS. 1B and 2B illustrate the fabrication of second level metallization by blanket deposition of an Al/Cu alloy film over the second dielectric film 4, followed by delineation of the desired pattern 9 by conventional techniques as discussed above, but modified in accordance with this invention. Basically, the metallization processing (evaporation) conditions are reversed. To this end, a second via pattern is formed by conventional lithographic technique in dielectric layer 4, followed by dry etching in an inert atmosphere (e.g. argon) to sputter clean the exposed first level metallization 3 (in the vias) and the dielectric layer 4. With the substrate at ambient temperatures (e.g. no heating) the evaporation of aluminum-copper metallization is initiated, while simultaneously initiating heating of the substrate to a temperature in the range of about 150° C. to about 200° C. over the deposition time of evaporation of the second level metallization 9. This results in metal deposition 9 over the dielectric layer 4 and within the vias on the first level metallization 8. Where a blanket metal coating 9 is employed, it can be delineated into the diffused pattern by conventional lithographic techniques as discussed above for the first layer metallization 3.

After formation of the second level Al/Cu pattern 9, the structure, if desired, can be processed in a sintering operation at 400° C. for 75 minutes, solely to reduce the via or interconnection resistance, at the interface 10 between the double layers 3 and 9 by metal diffusion. However, when the Al₂Cu intermetallics are not exposed on the surface of the first level Al/Cu metallization 3, the sintering step is not needed.

It may be noted that during the sintering operation it is immaterial if the first level copper (in metal layer 3) diffuses up, since its surface is covered which prevents copper oxidation and corrosion, by the initial low copper in aluminum alloy film of the second level metal deposition while at low temperature at the start of the evaporation cycle.

Although the invention has been particularly shown and described with reference to the preferred embodiments thereof, it will be understood that the foregoing and other changes in form and detail may be made therein without departing from the spirit and scope of the invention.

What is claimed is:

1. A method of fabricating thin film interconnected metallization on a dielectric coated integrated circuit substrate having ohmic contact via openings through said dielectric to elements of said circuit, comprising:
forming a vacuum environment about said substrate;
heating said substrate in said vacuum environment to between about 180° C. to about 200° C. to condition said substrate for deposition of first level metallization film;
discontinuing said heating and coincidently initiating evaporation of said first level metallization to deposit, during cooling of said substrate, a first aluminum-copper metal film over said dielectric and in said ohmic contact via openings;
defining in said first metallization film a predetermined interconnection pattern to said circuit elements;
depositing a dielectric layer over said first metallization level and said dielectric coating;
forming a second pattern of via openings in said dielectric layer to expose selected portions of said first metallization pattern;
dry etching to sputter clean said exposed first level metallization pattern and said dielectric layer in an inert atmosphere and at ambient temperatures;
initiating evaporation of a second level aluminum-copper film at ambient temperatures over said dielectric layer and in said second vias and
coincidentally initiating heating of said substrate to a temperature in the range of about 150° C. to about 200° C. over the deposition time of said evaporation of said second level metallization.

2. The method of claim 1 wherein said inert atmosphere is argon.

3. The method of claim 1 including heating the substrate at about 400° C. for about 75 minutes to interdiffuse said first and second metallization levels in said second via pattern.

4. The method of claim 3 wherein said inert atmosphere is argon.

* * * * *